Dec. 24, 1963 J. S. KILBY 3,115,581

MINIATURE SEMICONDUCTOR INTEGRATED CIRCUIT

Filed May 6, 1959

2 Sheets-Sheet 1

INVENTOR

Jack S. Kilby

BY

Stevens, Davis, Miller & Mosher

ATTORNEYS

INVENTOR
Jack S. Kilby

BY
Stevens, Davis, Miller & Mosher
ATTORNEYS 3,115,581

MINIATURE SEMICONDUCTOR INTEGRATED CIRCUIT

Jack S. Kilby, Dallas, Tex., assignor to Texas Instruments Incorporated, Dallas, Tex., a corporation of Delaware Filed May 6, 1959, Ser. No. 811,371
19 Claims. (Cl. 307—88.5)

This invention relates to a miniature semiconductor integrated circuit. More particularly, this invention relates to a unique integrated solid state bistable multivibrator circuit subcombination which is fabricated from semiconductor material.

Many methods and techniques for miniaturizing electronic circuits have been proposed in the past. At first, most of the effort was spent upon reducing the size of the components and packing them more closely together. Work directed toward reducing component size is still going on. Other efforts have been made to reduce the size of electronic circuits such as by eliminating the protective coverings from components, by using more or less conventional techniques to form components of a complete circuit on a single substrate, and by providing the components with a uniform size and shape to permit closer spacings in the circuit packaging therefor.

All of these methods and techniques require a very large number and variety of operations in fabricating a complete circuit. For example, of all circuit components, resistors are usually considered the most simple to form, but when adapted for miniaturization by conventional techniques, fabrication requires at least the following steps:

(*a*) Formation of the substrate.
(*b*) Preparation of the substrate.
(*c*) Application of terminations.
(*d*) Preparation of resistor material.
(*e*) Application of the resistor material.
(*f*) Heat treatment of the resistor material.
(*g*) Protection or stabilization of the resistor.

Capacitors, transistors and diodes when adapted for miniaturization each require at least as many steps in the fabrication thereof. Unfortunately, many of the steps required are not compatible. A treatment that is desirable for the protection of a resistor may damage another element formed on the same substrate, such as capacitor or transistor, and as the size of the complete circuit is reduced, such conflicting treatments, or interactions, become of increasing importance. Interactions may be minimized by forming the components separately and then assembling them into a complete package, but the very act of assembly may cause damage to the more sensitive components.

Because of the large number of operations required, control over miniaturized circuit fabrication becomes very difficult. To illustrate, many raw materials must be evaluated and controlled even though they may not be well understood. Further, many testing operations are required hand, even though a high yield may be obtained for each operation, so many operations are required that the over-all yield is often quite low. In service, the reliability of a circuit produced by methods of such complexity may also be quite low due to the tremendous number of controls required. Additionally, the separate formation of individual components requires individual terminations for each component. These terminations may eventually become as small as a dot of conductive paint. However, they still account for a large fraction of the usable area or volume of the circuit and may become an additional cause of circuit failure or rejection due to misalignment.

In contrast to the approaches to miniaturization that have been made in the past, the present invention has resulted from a new and totally different concept for miniaturization. This concept and circuit elements made in accordance therewith are the subject matter of a pending application, Serial No. 791,602, filed February 6, 1959, by the same inventor and assigned to the same assignee as the instant application. Radically departing from the techings of the art, it is proposed in that pending application that miniaturization can best be attained by use of as few materials and operations as possible. In accordance with the principles disclosed in that pending application, the ultimate in circuit miniaturization is attained using only one material for all circuit elements and a limited number of compatible process steps for the production thereof.

The above is accomplished by utilizing a body of semiconductor material exhibiting one type of conductivity, either N-type or P-type, and processing certain regions thereof by adding significant impurity materials thereto so as to form certain kinds of circuit components, such as diodes and transistors. Other regions of the basic semiconductor body may inherently perform functions of certain other circuit components, such as resistors. According to the principles of the invention disclosed in the instant application, all components of a circuit such as a bistable multivibrator circuit subcombination are therefore fabricated within a body of semiconductor material by using the novel techniques described in said pending application together with certain new techniques. All components of this circuit are integrated into the body of semiconductor material and actually constitute portions thereof.

Of importance to this invention is the concept of shaping. As described in detail in said pending application, this shaping concept makes it possible in a circuit to obtain the necessary isolation between components and to define the components or, stated differently, to limit the area which is utilized for a given component. Shaping may be accomplished in a given circuit in one or more of several different ways. These various ways include actual removal of portions of the semiconductor material, specialized configurations of the semiconductor material such as rectangular, L-shaped, U-shaped, etc., selective conversion of intrinsic semiconductor material by diffusion of impurities thereinto to provide low resistivity paths for current flow and selective conversion of semiconductor material of one conductivity type to conductivity of the opposite type wherein the P-N junction thereby formed acts as a barrier to current flow. In any event, the effect of shaping is to direct and/or confine paths for current flow thus permitting the fabrication of circuits which could not otherwise be obtained in a single wafer of semiconductor material. As a result, the final circuit is arranged in essentially planar form. It is possible to shape the wafer during processing and to produce by diffusion the various circuit elements in a desired and proper relationship.

Certain of the circuit components described in said pending application have utility in and of themselves. However, they perhaps find their greatest utility as integral parts of miniature semiconductor solid state circuit devices. Therefore, it is a principle object of this invention to provide a novel miniaturized semiconductor solid state circuit device which can function as one-half of a bistable transistor multivibrator circuit.

It is another principal object of this invention to provide a miniature semiconductor solid state circuit bistable multivibrator subcombination which is fabricated from a body of semiconductor material, portions of which are processed so as to form therein a transistor, diode or capacitor, and wherein all components of the circuit subcombination are completely fabricated within the body of the semiconductor material.

It is a further object of this invention to provide a unique miniaturized solid state bistable multivibrator subcombination circuit structure which is substantially smaller, more compact, and simpler than circuit packages which heretofore have been developed using known techniques.

Another object is to provide an integrated circuit which is formed in a wafer of single-crystal semiconductor material and which includes at least a transistor along with its load and input resistors or other necessary components.

It is yet a further object of the present invention to provide a unique miniaturized solid state bistable multivibrator circuit subcombination comprising a body of semiconductor material wherein a transistor and its load is fabricated within one portion of the semiconductor body, and various input circuits to the transistor are fabricated within other portions of the semiconductor body.

Other and further objects of the present invention will become more readily apparent from the following detailed description of a preferred embodiment of the present invention when taken in conjunction with the appended drawings, in which.

Figure 2:
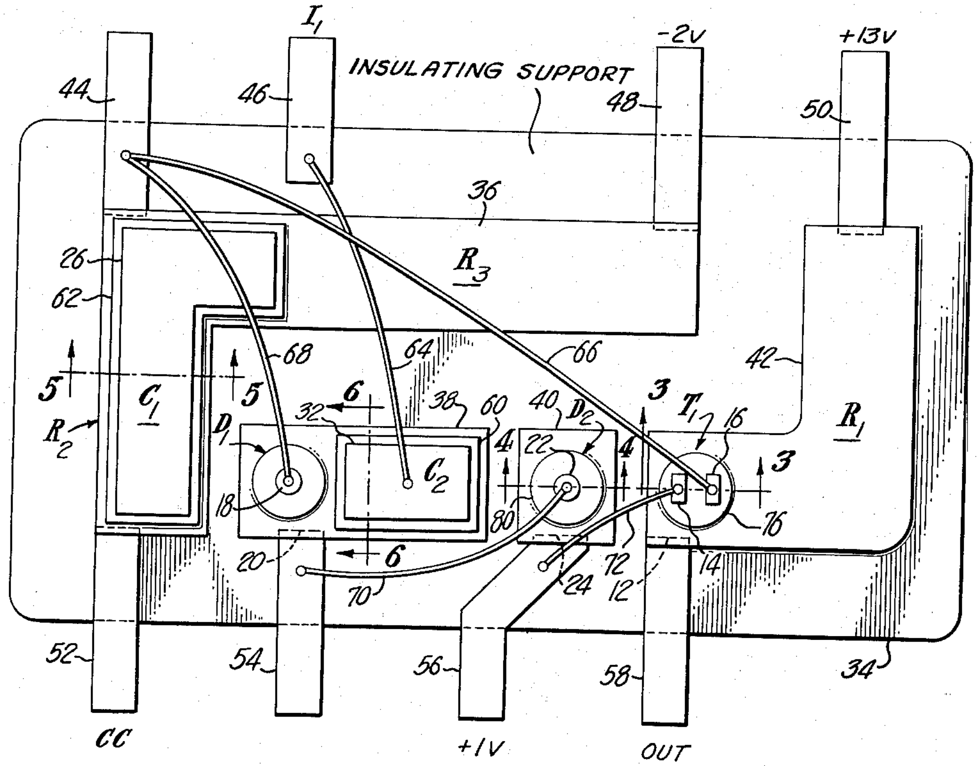
FIGURE 2 is a pictorial diagram illustrating the miniaturized solid state bistable multivibrator subcombination of the present invention.
Figure 3:
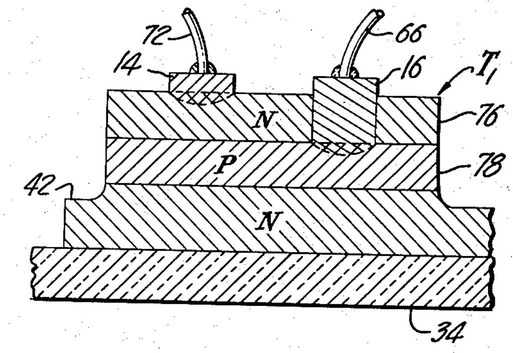
Figure 3A:
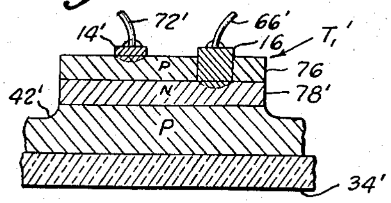

FIGURES 3, 4, 5 and 6 are cross sectional views along lines 3—3, 4—4, 5—5 and 6—6, respectively, of FIGURE 2 of portions of the solid state multivibrator circuit shown in FIGURE 2;

FIGURE 3A is a P-N-P counterpart of the transistor structure shown in FIG. 3.

Figure 1:
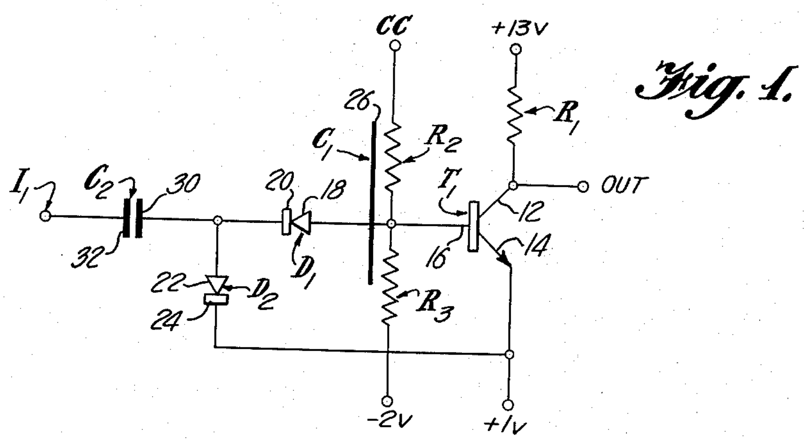
FIGURE 1 is a conventional schematic line diagram of the bistable multivibrator circuit subcombination which is fabricated within a body of semiconductor material in accordance with the principles of the present invention.

Referring now to FIGURE 1, there is shown a conventional schematic diagram of the multivibrator subcombination circuit which is fabricated from semiconductor material. The active element $T_1$ is an N-P-N transistor whose collector electrode 12 is connected to a positive potential through resistor $R_1$. Emitter electrode 14 is connected to another source of lesser positive potential, to which is also connected the cathode electrode 24 of diode $D_2$. Base electrode 16 of transistor $T_1$ is connected to a source of negative potential through a resistor $R_3$. Base electrode 16 is further connected to anode electrode 18 of diode $D_1$ and to one terminal of resistor $R_2$. Plate 26 represents distributed capacitance $C_1$ which is essentially in parallel with all of resistor $R_2$ and a portion of resistor $R_3$. Cathode electrode 20 of diode $D_1$ is connected to one plate 30 of capacitor $C_2$ and also to anode electrode 22 of diode $D_2$. Plate 32 of capacitor $C_2$ is connected to a trigger input terminal $I_1$.

The circuit shown in FIGURE 1 represents but one-half of a bistable multivibrator circuit, sometimes called an Eccles-Jordan flip-flop circuit. To form the complete flip-flop circuit, a second circuit exactly like that in FIGURE 1 is connected to the circuit of FIGURE 1 in the following manner. The OUT lead from collector electrode 12 in FIGURE 1 is connected to the CC terminal of the second circuit. The CC terminal of FIGURE 1 is connected to the OUT lead of the second circuit. In the complete bistable multivibrator circuit, then, the collector of one transistor is cross-coupled to the base of the other transistor through the R-C circuit $R_2$ and $C_1$, and vice versa.

The operation of the circuit shown in FIGURE 1 may best be understood if it is considered to be within a complete flip-flop circuit as described in the preceding paragraph. If transistor $T_1$ is in its conducting state, a negative pulse at input $I_1$ coupled through $C_2$ and buffer diode $D_1$ causes the base 16 potential to drop below that of emitter 14, thus attempting to cut off $T_1$. The voltage at collector 12 then begins to rise and thereby causes the cross-coupled base electrode of the nonconducting transistor in the second circuit to rise in potential above that of its associated emitter. This previously non-conducting transistor therefore begins to conduct, while transistor $T_1$ in FIGURE 1 becomes completely cut off due to the transmission of the fall in potential of the collector of the previously non-conducting transistor to base 16 of transistor $T_1$ through resistor $R_2$ and capacitor $C_1$. A similar operation would occur in order to again change the state of the bistable multivibrator circuit, except that the trigger pulse would be applied to the other now conducting transistor. Capacitor $C_1$ functions to increase the switching speed of the circuit.

The present invention is shown in FIGURE 2 in which the multivibrator subcombination of FIGURE 1 is fabricated or integrated within portions of a single crystal body of semiconductor material. In the preferred form of the present invention, the starting material is a wafer of semiconductor material of N-type conductivity and about 0.2 inch by 0.08 inch by about 0.003 inch thick. This wafer is attached to a ceramic plate which is slightly larger in area and thick enough to provide suitable support for the semiconductor material. The semiconductor material is then subjected to selective deep etching to form four associated portions of an N-type semiconductor material or wafer strips 36, 38, 40 and 42 attached to supporting substrate 34 in the configuration as shown in FIGURE 2. Actually, it is quite often desirable, although not absolutely necessary to perform certain diffusion, material deposition and etching steps before the deep etching treatment. In fact, although the formation process for producing the several circuit components within the semiconductor material are described individually for each wafer strip, for the sake of clarity, it has been found most expedient to perform as many of component formation steps of diffusion, material deposition and etching on the various regions of the single starting wafer before it is divided into the several wafer strips in the "form etching" process. Metal contact strips 44, 46, 48, 50, 52, 54, 56 and 58 are also placed on substrate 34 and selectively underlie the wafers to provide input and output terminals for the signal and bias voltages shown in FIGURE 1. More particularly all of the above-identified contact strips, with the exception of 46, extend beneath various regions of wafer strips 36, 38, 40 and 42, as shown by the dashed lines in FIGURE 2, such as lines 12, 20 and 24, so as to make ohmic connections thereto. Contact strip 46 does not make a direct ohmic contact to any of the above-identified semiconductor wafers. However, contact strip 46 is connected to one of the fabricated circuit components which is contained within a region of wafer strip 38, which subsequently will be discussed. Contact strips 44 and 54 are not used to introduce or remove signals from the solid state circuit on substrate 34. However, they do make ohmic contacts with regions in their associated wafers 36 and 38. Therefore, they may be used as internal terminal posts when connecting the components found within the wafer strips.

The fabrication of circuit components within wafer 42 will now be described, with particular reference to FIGURE 2. For the purpose of this and subsequent paragraphs, the regions of a wafer strip have been marked in FIGURE 2 with symbols representative of the circuit element functions that are performed therein which correspond to the circuit components found in FIGURE 1. Wafer strip 42 is formed in the shape of an L having a vertical and a horizontal leg. The particular dimensions of wafer 42 are designed so that the sum of the effective bulk resistances of the semiconductor material of the two legs is equal to the desired value of resistor $R_1$ which is shown in FIGURE 1. This resistance may be calculated from the following equation:

$$R=\rho L/A$$

where L is the sum of the active lengths of the two legs in centimeters, A is the cross-sectional area of the wafer, and $\rho$ is the resistivity in ohm-centimeters of the N-type semiconductor material of which wafer 42 is made.

The left-hand region (in the drawing) of the horizontal leg of wafer strip 42 is processed so as to form transistor $T_1$ therein. FIGURE 3 shows a cross-sectional view of the said left-hand region which shows how the transistor is fabricated. A P-region 78 is formed within this region of wafer 42 in any well-known manner, such as by the vapor diffusion of significant impurities into the strip so as to form a rectifying P-N junction therein. A second N-region 76 is formed in wafer strip 42 over the P-region 78 so as to form a second rectifying P-N junction between regions 76 and 78. The wafer strip 42 is then subjected to an etching treatment, using well known transistor techniques, to remove both diffused layers 76 and 78 from the wafer strip except in the circled area on the left-hand region of the wafer strip. The regions 76, 78 and the left-hand region of wafer 42 which lies beneath them now comprise an N-P-N transistor. In the particular embodiment shown in FIGURES 2 and 3, region 76 is the emitter region of this transistor, the region 78 is the base region, and N-region of wafer 42 underlying region 76 and 78 is the collector of the transistor. A metal emitter electrode or contact 14 is attached to region 76, such as by vacuum deposition and alloying, so as to form an ohmic contact for the emitter, and a metal base electrode 16 is applied in the same manner and alloyed through region 76 so as to provide ohmic contact to base region 78 and rectifying contact to region 76. The junction between contact 16 and region 76 may be etched if desired as customary in the art in the formation of double diffused transistor such as is constituted by $T_1$. Contact strips 50 and 58 further contact in ohmic fashion the wafer strip 42 at the regions shown in FIGURE 2.

Referring now to FIG. 3A, there is illustrated a transistor device which is the P-N-P counterpart of the N-P-N device of FIG. 3. The parts in FIG. 3A corresponding with parts of FIG. 3 have been identified by the same reference characters as in FIG. 3 but with a prime (′) notation, such as 34′ which identifies the substrate.

Figure 4:
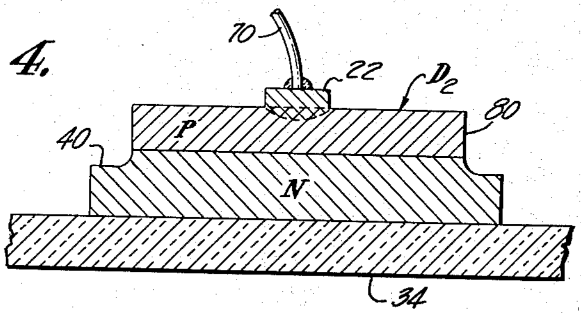

The construction of diode $D_2$ in wafer strip 40 will now be described, with particular reference to FIGURE 4. A P-region 80 is created in wafer strip 40, preferably in the same manner and at the same time the P-region 78 is formed in wafer strip 42, thus forming a rectifying P-N junction, the junction of $D_2$. A metal contact 22 is ohmically connected to region 80 just as was contact 14 to $T_1$. Thus, it is seen that a diode having an anode 80 and a cathode 40 has been fabricated from the original single body crystal of N-type semiconductor material. This diode corresponds to $D_2$ in FIGURE 1. Contact strip 56 further ohmically contacts wafer 40 to form cathode electrode 24 as shown in FIGURE 2.

Figure 5:
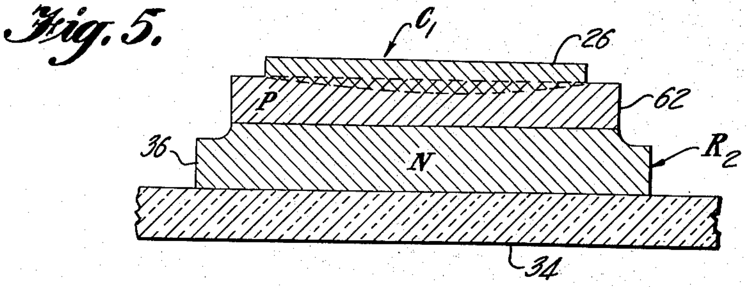

The construction of the components of wafer strip 36 will now be described, with particular reference to FIGURE 5. In the particular embodiment as shown in FIGURE 2, wafer 36 is in the shape of an L with a vertical and a horizontal leg. The length and cross-sectional area of the horizontal leg is calculated so as to furnish the desired resistance of resistor $R_3$ found in FIGURE 1. The length and cross-sectional area of the vertical leg is such as to provide the desired resistance of resistor $R_2$. Furthermore, as shown in FIGURE 1, a distributed capacitance $C_1$ is connected in parallel with resistor $R_2$ and a portion of $R_3$. FIGURE 5 shows a cross-sectional view of the actual construction of capacitor $C_1$ in the fabricated circuit of FIGURE 2 which utilizes inherent capacitance of a P-N junction. The vertical leg and a portion of the horizontal leg of wafer 36 provide one plate of this capacitor. On these portions of these legs is created a region 62 of P-type semiconductor material so as to form a P-N rectifying junction therebetween. The P-type region 62 may be created by diffusion in the same manner as and preferably simultaneously with, region 80 of water strip 40 and region 78 of wafer strip 42. A metallic plate 26 which may be a vapor deposited layer and alloyed of gold, aluminum or other metal, makes further ohmic contact with P-region 62. A capacitor fabricated on a single body of semiconductor material and one method of forming the same are described and claimed in the aforementioned copending application, Serial Number 791,602. Contact strip 52 makes contact only with the lowest portion of the vertical leg of wafer 36 as shown by dashed lines in FIGURE 2, this lower portion being equivalent to the upper terminal of resistor $R_2$ shown in FIGURE 1. Thus, the vertical leg and a portion of the horizontal leg of wafer section 36 has been processed so as to form a distributed capacitance R-C circuit. It will be noted that the metallic layer 26 of capacitor C1, which is actually the capacitance of the reverse biased P-N junction between P-layer 62 and the N-type region of wafer strip 36, does not appear to be connected directly to the circuit at any point. However, to those skilled in the art it will be apparent that such consruction is roughly equivalent to a capacitance connected in parallel with $R_2$. Contact strips 44 and 48 are also ohmically connected to wafer 36 at the regions shown in FIGURE 2.

Figure 6:
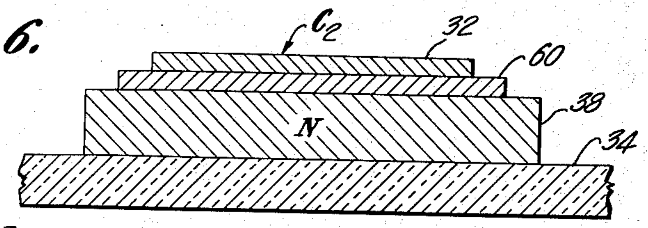

The construction of the components of wafer strip 38 will now be described with particular reference to FIGURE 6. Diode $D_1$, which is shown in FIGURE 1, is fabricated into the left-hand region of wafer strip 38 in a manner shown by FIGURE 4, above described. Capacitor $C_2$ is fabricated into the remaining right-hand region of wafer strip 38 in a manner shown by FIGURE 6, which is a cross-sectional view. This region of wafer strip 38 provides one plate of this capacitor. Formed onto this region is a layer 60 which provides a dielectric layer for capacitor $C_2$. An oxide of silicon has been found to be a suitable material for this dielectric layer, as explained in the aforementioned pending application, Serial Number 791,602. A plate 32 forms the other plate and is provided by evaporating a conductive material onto layer 60. Gold and aluminum have been found to be satisfactory materials for plate 32. Contact strip 54 ohmically contacts wafer strip 38 at its left-hand portion and it serves as an internal connecting point.

It now remains to connect various circuit components found in each of the above-described wafer strips into a completed circuit diagrammed in FIGURE 1. Wire connectors 64, 66, 68, 70 and 72 perform this function. Base electrode 16 of transistor $T_1$ is connected by connector 66 to contact strip 44 and thus to the common terminal of resistors $R_2$ and $R_3$. Also, the anode electrode 18 of diode $D_1$ is connected to this latter junction by connector 68. The emitter electrode 14 of the transistor is connected to contact strip 56 by connector 72 and thus to the cathode of diode $D_2$ which is formed by the wafer strip 40. The anode electrode 22 of diode $D_2$ is connected to contact strip 54 by the connector 70 and thus to the cathode of diode $D_1$ which consists of the left-hand region of wafer strip 38. Furthermore, the remaining right-hand region of wafer strip 38 forms one plate 30 (see FIGURE 1) of capacitor $C_2$. The other plate 32 of capacitor $C_2$ is connected by wire 64 to contact strip 46.

A brief explanation of the signal and bias voltage input to the fabricated circuit of FIGURE 2 will now be given, coresponding to those shown in FIGURE 1. Positive potential is applied by contact strip 50 to the left-hand region of the horizontal leg of wafer strip 42, corresponding to the collector of transistor $T_1$, through the vertical and horizontal legs of wafer 42 which corresponds to resistor $R_1$. A satisfactory voltage has been found to be +13 v. Contact strip 58 is also connected to the collector region of this transistor and so provides the output at the collector of $T_1$. A small positive bias is applied to contact strip 56 and thus to the emitter electrode 14 of the transistor in wafer 42. A potential of +1 volt has been found satisfactory. This positive bias is also applied to the cathode of diode $D_2$ by virtue of contact strip 56 being connected to wafer strip 40. A small negative bias, for example, −2 v., is applied by contact strip 48 to the base electrode 12 of the transistor through contact strip 44 and the horizontal leg of wafer strip 36 which corresponds to resistor $R_3$. This is because contact strip 44 is ohmically connected to the junction of the vertical and horizontal legs of wafer strip 36, and thus it also connects the base electrode to one terminal of resistor $R_2$. Anode electrode 18 of diode $D_1$ in wafer strip 38 is also connected to the base electrode 16 of the transistor at contact strip 44, and its cathode, which is the left-hand region of wafer strip 38, is connected by contact strip 54 to the anode electrode 22 of diode $D_2$ in wafer strip 40. Plate 32 of capacitor $C_2$ is connected to contact strip 46 which constitutes input terminal $I_1$ and receives the trigger pulse when two of the solid state circuits of FIGURE 2 are being used to form a complete bistable multivibrator. The operation of such a solid state multivibrator is similar to that described in connection with FIGURE 1.

The techniques for fabricating various circuit components within a single body of semiconductor material have been described in the aforementioned pending application, which is herein incorporated by reference. For example, the transistor of FIGURE 3 in the instant patent may be fabricated by depositing the P-region 78 and N-region 76 by means of the well-known diffusion process, or others, and then etching away portions of these regions so as to obtain their desired external area. Furthermore, in practice the several wafers shown in FIGURE 2 may be formed individually and then placed on the supporting substrate and interconnected. The exact shape of the various wafer strips are unimportant to the operation of the circuit. The geometrical L shape of wafer strip 42, for example, merely provides compactness. Also, the wafers of FIGURE 2 are there shown entirely disconnected from each other, except for the metallic connecting wires 64, 66, etc., in order to prevent short circuits between certain components. However, it is possible to fabricate the circuit of the instant invention into a single body of high resistivity or essentially intrinsic semiconductor material in which there have been produced N-type or P-type layers which are in the form of wafer strips 36, 38, 40 and 42 and insulated from each other by the "intrinsic" semiconductor material underlying them. A circuit device fabricated in such a manner assumes the same configuration as shown in FIGURES 2, 3, 4, 5 and 6, except that the substrate 34 represents the supporting layer of intrinsic semiconductor material in such a device and contact tabs 44, 46, 48, 50, 52, 54, 56 and 58 are alloyed completely through the intrinsic layer 34 to form low resistance contacts to the several regions defining the circuit components.

Although the invention has been shown and described in terms of a specific embodiment, it will be evident that many changes and modifications are possible which do not in fact depart from the inventive concepts taught herein. For example, the bistable multivibrator subcombination circuit may utilize a P-N-P transistor or possibly other forms of transistors. In such a case, the semiconductor body adjacent the substrate 34 is a P-type semiconductor material. Hence, such changes and modifications are deemed to fall within the purview of the invention, as defined by the appended claims.

What is claimed is:

1. A miniature semiconductor solid state circuit device adaptable for use in a bistable multivibrator comprising a body of semiconductor material principally of one type conductivity forming a plurality of semiconductor portions, means for substantially electrically isolating the portions from each other, a first of said portions having a transistor formed integrally therein, said transistor having emitter, base and collector regions, said collector region being defined by a first region in said first portion, said first portion also including a second region which is contiguous to the said first region therein and which defines a load resistance, a second of said portions having a first region defining a bias resistance and a second region contiguous to said first region of said second portion so as to define an additional resistance, said additional resistance in said second region defining a cross-coupling resistance, means for connecting the base region of said transistor to the juncture between the first and second regions of said second portion, terminal means connected to the said second region in said second portion, means for applying a potential to the emitter region of said transistor, means for applying a potential to the said second second region in said first portion, means for applying a potential to the first region in said second portion, and means for applying a signal to the base region of said transistor.

2. A circuit device according to claim 1 which includes means for providing distributive capacitance in parallel with said second region in said second portion.

3. A circuit device according to claim 2 which further includes means for providing distributive capacitance in parallel with said first region in said second portion.

4. A circuit device according to claim 1 in which said means for applying a signal to the base region of said transistor includes a third portion of said body having a first diode formed integrally therein, said diode having first and second electrode regions, said first electrode region being defined by a first region in said third portion, said third portion also including a second region contiguous to said first region therein, said second region defining one plate of a coupling capacitor, means providing the other plate of said coupling capacitor, means for connecting said other plate means to a signal input terminal, and means for connecting the second electrode region of said first diode to the base region of said transistor.

5. A circuit device according to claim 4 which includes means for providing distributive capacitance in parallel with said second region in said second portion.

6. A circuit device according to claim 5 which further includes means for providing distributive capacitance in parallel with said first region in said second portion.

7. A circuit device according to claim 6 in which a fourth of said portions has a second diode formed integrally therein, said second diode having first and second electrode regions defined by a first and second region of said fourth portion, respectively, means connecting said first electrode region in said fourth portion to the emitter region of said transistor, and means connecting said second electrode region of said second diode to said first region of said third portion.

8. A circuit device having a plurality of regions of semiconductor material mounted on a single insulating substrate, said regions having differing conductivity types and resistivities and including a transistor and a plurality of resistors formed in said semiconductor material, said transistor having an emitter, base and collector, one of said resistors having one of its terminal ends formed by the collector of said transistor and two other of said resistors each being connected at one of their terminal ends to the base of said transistor, and external electrical contacts to the emitter and collector of said transistor and to each of the other terminal ends of each of said resistors.

9. A circuit device as defined in claim 8 having additional regions of semiconductor material on said substrate, said regions defining a diode and a capacitance, a first electrode of said diode being connected to the base of said transistor, the other electrode of said diode being connected to one plate of said capacitance and the other plate of said capacitance having an external electrical contact thereto.

10. A circuit device as defined in claim 8 having a further region of semiconductor material defining a second diode having a first electrode connected to the said other electrode of the first diode and its other electrode connected to the emitter of said transistor.

11. A circuit device as defined in claim 10 wherein said transistor is an N-P-N transistor and said first electrodes of said first and said second diodes are anodes.

12. A circuit device as defined in claim 10 wherein said transistor is a P-N-P transistor and said first electrodes of said first and said second diodes are cathodes.

13. A circuit device comprising a single body of semiconductor material having therein a plurality of regions some of which have differing conductivity types and resistivities, one of said regions defining a supporting layer providing electrical insulation between the others of said regions, the others of said regions defining a transistor and a plurality of resistors, said transistor having an emitter, base and collector, one of said resistors being connected at one of its terminal ends to the collector of said transistor, two other of said resistors each being connected at one of their terminal ends to the base of said transistor and external electrical contacts to the emitter and collector of said transistor and to each of the other terminal ends of said resistors.

14. A circuit device as defined in claim 13 having additional regions of semiconductor material defining a diode and a capacitance, a first electrode of said diode being connected to the base of said transistor, the other electrode of said diode being connetced to one plate of said capacitance and the other plate of said capacitance having an external electrical contact thereto.

15. A circuit device as defined in claim 14 having a further region of semiconductor material defining a second diode having a first electrode connected to said other electrode of the first diode and its other electrode connected to the emitter of said transistor.

16. A circuit device as defined in claim 15 wherein said transistor is an N-P-N transistor and said first electrodes of said first and said second diodes are anodes.

17. A circuit device as defined in claim 15 wherein said transistor is a P-N-P transistor and said first electrodes of said first and said second diodes are cathodes.

18. A circuit device having a plurality of regions of semiconductor material mounted on a single insulating substrate, said regions having differing conductivity types and resistivities and including a transistor and a plurality of resistors formed in said semiconductor material, said transistor having an emitter, base and collector, one of said resistors having one of its terminal ends formed by the collector material of said transistor and the two other of said resistors each being connected at one of their terminal ends to the base of said transistor, a conductive plate overlying substantially the entire region forming said two other resistors to provide a distributive capacitance in parallel wtih said two other resistors, and external electrical contacts to the emitter and collector of said transistor and to each of the other terminal ends of each of said resistors.

19. A miniature semiconductor integrated circuit device comprising;

(*a*) a thin wafer of monocrystalline semiconductor material;

(*b*) a junction transistor defined in the wafer adjacent one major face thereof by contiguous regions of alternate conductivity types, the transistor including collector, base and emitter regions;

(*c*) a plurality of elongated regions of the semiconductor material defined in the surface of the wafer adjacent said one major face, each of the elongated regions providing a resistive current path parallel to said one major face, each of the elongated regions having an upper surface lying on said one major face and there occupying only a limited area of said one major face, the elongated regions being laterally spaced along said one major face and electrically insulated along at least the major portion of their lengths from one another and from the transistor;

(*d*) a first electrical contact engaging one end of a first of the elongated regions, (*e*) first conductive means engaging the wafer at the other end of said first elongated region and also engaging the collector region of the transistor so that the first elongated region provides a collector load resistor for the transistor;

(*f*) an emitter contact and a base contact adherent to the surface of the wafer on said one major face and making electrical contact to the emitter and base regions of the transistor, respectively;

(*g*) means connected to said first electrical contact and to said emitter contact for supplying operating bias potential to the transistor;

(*h*) a plurality of contacts engaging the wafer at spaced-apart positions on a second of the elongated regions;

(*i*) second conductive means electrically connecting one of the plurality of contacts to said base contact;

(*j*) and means connected to one of the plurality of contacts for supplying bias potential thereto.

References Cited in the file of this patent

UNITED STATES PATENTS

| | | |
|---|---|---|
| 2,662,957 | Eisler | Dec. 15, 1953 |
| 2,663,830 | Oliver | Dec. 22, 1953 |
| 2,734,151 | Jacobs | Feb. 7, 1956 |
| 2,735,948 | Sziklai | Feb. 21, 1956 |
| 2,748,041 | Leverenz | May 29, 1956 |
| 2,816,228 | Johnson | Dec. 10, 1957 |
| 2,856,544 | Ross | Oct. 14, 1958 |
| 2,861,200 | Henle | Nov. 18, 1958 |
| 2,875,505 | Pfann | Mar. 3, 1959 |
| 2,889,469 | Green | June 2, 1959 |
| 2,985,804 | Buie | May 23, 1961 |
| 3,029,366 | Lehovec | Apr. 10, 1962 |

OTHER REFERENCES

Proceedings of the IRE, May 1959, pages 902 and 903.

"Using Thin Films in Microminiaturization," by Mansfied, Electronic Design, January 21, 1959, pages 38, 39, and 40.

"Semiconductor Solid Circuitry," Electronics, April 10, 1959, page 82.